United States Patent
Nohava et al.

(10) Patent No.: US 6,674,777 B1
(45) Date of Patent: Jan. 6, 2004

(54) PROTECTIVE SIDE WALL PASSIVATION FOR VCSEL CHIPS

(75) Inventors: James C. Nohava, Inver Grove Heights, MN (US); Robert A. Morgan, Plymouth, MN (US); Eva M. B. Strzelecka, Plymouth, MN (US); Yue Liu, Plymouth, MN (US)

(73) Assignee: Honeywell International Inc., Morristown, NJ (US)

(*) Notice: Subject to any disclaimer, the term of this patent is extended or adjusted under 35 U.S.C. 154(b) by 103 days.

(21) Appl. No.: 09/652,555

(22) Filed: Aug. 31, 2000

(51) Int. Cl.[7] ............................................. H01S 5/00
(52) U.S. Cl. .................................... 372/44; 372/45
(58) Field of Search ........................... 372/45, 96, 46, 372/50, 44; 257/88

(56) References Cited

U.S. PATENT DOCUMENTS

| | | | |
|---|---|---|---|
| 4,943,970 A | 7/1990 | Bradley | 372/45 |
| 4,949,350 A | 8/1990 | Jewell et al. | 372/45 |
| 4,949,351 A | 8/1990 | Imanaka | 372/45 |
| 5,115,442 A | 5/1992 | Lee et al. | 372/45 |
| 5,359,618 A * | 10/1994 | Lebby et al. | 372/45 |
| 5,517,039 A | 5/1996 | Holonyak, Jr. et al. | 257/94 |
| 5,550,081 A | 8/1996 | Holonyak, Jr. et al. | 437/129 |
| 5,574,738 A | 11/1996 | Morgan | 372/28 |
| 5,581,571 A | 12/1996 | Holonyak, Jr. et al. | 372/46 |
| 5,583,370 A | 12/1996 | Higgins, III et al. | 257/667 |
| 5,600,181 A | 2/1997 | Scott et al. | 257/723 |
| 5,696,023 A | 12/1997 | Holonyak, Jr. et al. | 437/133 |
| 5,708,280 A * | 1/1998 | Lebby et al. | 257/88 |
| 5,745,515 A | 4/1998 | Marta et al. | 372/45 |
| 5,764,671 A * | 6/1998 | Lebby et al. | 372/45 |
| 5,774,487 A | 6/1998 | Morgan | 372/45 |
| 5,851,849 A | 12/1998 | Comizzoli et al. | |
| 5,956,576 A | 9/1999 | Toy et al. | 438/125 |
| 5,978,401 A | 11/1999 | Morgan | 372/50 |
| 6,048,748 A | 4/2000 | Khare et al. | |
| 6,317,446 B1 * | 11/2001 | Wipiejewski | 372/46 |

OTHER PUBLICATIONS

Hayashi et al, "Lasing Characteristics of Low–Threshold Oxide Confinement InGaAs–GaAlAs Vertical–Cavity Surface–Emitting Lasers", IEEE Photonics Technology Letters, vol. 7, No. 11, Nov. 1995, pp. 1234–1236.*

International Search Report, dated Apr. 11, 2003, relative to PCT application No. PCT/US 01/26921, the foreign equivalent to the instant U.S. application 09/652,555.

Huffaker, D., et al., "Sealing AlAs against oxidative decomposition and its use in device fabrication", article, QELS '96, Summaries of Papers Presented at the Quantum Electronics and Laser Science Conference, vol. 10, 1996 Technical Digest Series, Conference Ed, pg. 83, XP002236166. (no month available).

Nakahara, T., et al., "Hybrid integration of smart pixels by using polymide bonding: demonstration of a GaAs p–I–n photodiode/CMOS receiver", article, IEEE Journal of Selected Topics in Quantum Electronics, IEEE Service Center, vol. 5, No. 2, Mar 1999, pp. 209–16, XP000865282.

* cited by examiner

Primary Examiner—Quyen Leung
(74) Attorney, Agent, or Firm—Andrew A. Abeyta

(57) ABSTRACT

Methods for sealing or passivating the edges of chips such as vertical cavity surface emitting lasers (VCSEL) is disclosed. One method includes oxidizing the edges of die at the wafer level prior to cutting the wafer into a plurality of die. This may be accomplished by etching a channel along the streets between die, followed by oxidizing the channel walls. The oxidation preferably oxidizes the aluminum bearing layers that are exposed by the channel walls inward for distance. Aluminum bearing layers, including AlAs and AlGaAs, may be oxidized to a stable native oxide that is resistant to further oxidation by the environment. After oxidation, the wafer can be cut along the channels into a number of die, each having a protective oxide layer on the side surfaces.

13 Claims, 5 Drawing Sheets

PROTECTIVE SIDE WALL PASSIVATION FOR VCSEL CHIPS

FIELD OF THE INVENTION

The present invention is related generally to electronics semi-conductor processing. More specifically, the present invention is related to controllable oxidization of the side edges of die at the wafer level, and in particular the passivation of the side edges of aluminum bearing Group III–V semiconductor layers in electronic or electro-optical devices, such as VCSEL chips.

BACKGROUND OF THE INVENTION

Semiconductor lasers are commonly used in modern technology as a light source in various devices, including communication devices, such as fiber optic transmitters, and compact disc players. A typical semiconductor laser is a double heterostructure with a narrow bandgap, high refractive index layer surrounded on opposed major surfaces by wide bandgap low refractive index layers. The low bandgap layer is termed the "active layer" and the bandgap and refractive index differences serve to confine both charge carriers and optical energy to the active layer or region. Opposite ends of the active layer have mirror facets which form the laser cavity. The cladding layers have opposite conductivity types, and when current is passed through the structure, electrons and holes recombine in the active layer to generate light.

Surface-emitting, rather than edge-emitting lasers have been developed. One surface-emitting laser is a "vertical cavity surface emitting laser" (VCSEL). Vertical Cavity Surface Emitting Lasers offer numerous performance and potential producibility advantages over conventional edge emitting lasers. These include many benefits associated with their geometry.

Surface emitting devices can be fabricated in arrays with relative ease while edge emitting devices cannot be as easily fabricated. An array of lasers can be fabricated by growing the desired layers on a substrate and then patterning the layers to form the array. Individual lasers may be separately connected with appropriate contacts. Such arrays are potentially useful in such diverse applications as, for example, image processing, inter-chip communications (i.e., optical interconnects), and so forth. Typical edge-emitter lasers are turned on and off by varying the current flow through the device. This often requires a relatively large change in the current through the device which is undesirable. In comparison, surface-emitting lasers often require lower drive current, and thus the change of current to switch the VCSEL need not be as large.

High-yield, high performance VCSELs have been demonstrated, and exploited in commercialization. Surface-emitting AlGaAs-based VCSELs are producible in a manner similar to semiconductor integrated circuits, and are amenable to low-cost high-volume manufacture and integration with existing electronics technology platforms. Moreover, VCSEL uniformity and reproducibility have been demonstrated using a standard, unmodified commercially available metal organic vapor phase epitaxy (MOVPE) chamber and molecular beam epitaxy (MBE) chamber giving very high device yields.

VCSELs typically have an active region with bulk or one or more quantum well layers. On opposite sides of the active region are mirror stacks which are formed by interleaved semiconductor layers having properties, such that each layer is typically a quarter wavelength thick at the wavelength (in the medium) of interest thereby forming the high-reflectance mirrors for the laser cavity. There are opposite conductivity type regions on opposite sides of the active region, and the laser is typically turned on and off by varying the current through the active region.

VCSELs may have multiple aluminum bearing Group III–V layers. In particular, the VCSEL may have AlAs layers and AlGaAs layers. The aluminum bearing layers are protected from the environment in a vertical direction by the top surface, which can include one or more surface passivation layers. The aluminum bearing layers typically are exposed to the environment at the edges or side face surfaces, particularly after the wafer has been cut into individual die. The aluminum bearing edges can oxidize when the chip is placed into service in an oxidizing environment. The environmentally induced oxidation can cause unreliable oxidation, from the edge inward, of the aluminum bearing layers. If left unchecked, this lateral oxidization can sometimes reach the VCSEL device itself, thereby reducing performance or even preventing operation altogether. To prevent or inhibit such lateral oxidation of the aluminum bearing layers, the chip is commonly mounted in a hermetically sealed package. Hermetically sealed packages have a number of limitations. First, hermetically sealed packages can be relatively expensive, which increases the cost of the device. Second, hermetically sealed packages can be relatively bulky, which increases the space needed to mount the device on a circuit board or multi-chip package, both of which are undesirable.

What would be desirable is a method for sealing the edges of chips, particularly VCSEL chips, prior to cutting the chips from the wafer. VCSEL chips having sealed edges may not require a hermetically sealed package.

SUMMARY OF THE INVENTION

The present invention provides methods for passivating the edges or side faces of aluminum bearing Group III–V layers in die such as VCSEL die. In one illustrative method, a semiconductor wafer having multiple VCSEL die separated by streets is provided. The VCSEL die preferably have aluminum bearing layers disposed a depth under the laterally disposed top wafer surface. Channels are cut into the streets to a depth sufficient to expose the side edges of the deepest aluminum bearing lateral layer. The channels are then exposed to an oxidizing environment such as steam, oxygen, or any other suitable oxidizing environment.

The oxidizing atmosphere oxidizes the aluminum bearing layers into aluminum oxide layers, forming a stable native oxide passivating layer which is resistant to further oxidation by the intended working atmosphere. Some of the non-aluminum bearing layers of a VCSEL, including layers formed from GaAs, InGaAs, InGaAsN, GaAsN, GaAsP, InGaAsP, etc., may also oxidize, but at a reduced rate. In one embodiment, the aluminum bearing layers are oxidized about 10 to 15 microns into the channel wall. After the aluminum bearing layers are sufficiently oxidized, the wafer is removed from the oxidizing atmosphere. The heat (~440° C.) results in almost immediate drying.

The wafer can then be cut into discrete die with a blade using methods well known to those skilled in the art. The wafer cuts are preferably made along the channels without destroying the intentionally oxidized layers. Preferably, the channel walls are oxidized prior to cutting the wafer into individual die. Alternatively, however, it is contemplated that the wafer may be cut into individual die before the side walls are oxidized. In this latter embodiment, no channels need be formed.

The present invention also includes discrete VCSEL chip having passivated aluminum bearing layers around the chip periphery. In particular, the present invention includes VCSEL chips having AlAs and AlGaAs layers where the layer regions near the chips side edges or side faces are oxidized to form a stable native oxide. The native oxide layers are believed to include anhydrous forms of aluminum hydroxides and aluminum oxide hydroxides such as alpha-$Al_2O_3$, gamma-$Al_2O_3$, diaspore, and boehmite.

Chips made according to the present invention have side regions that are resistant to further oxidation by the environment. In particular, VCSEL chips made according to the present invention are believed suitable for direct mounting to boards without hermetically sealed packaging.

DETAILED DESCRIPTION OF THE INVENTION

Figure 1:
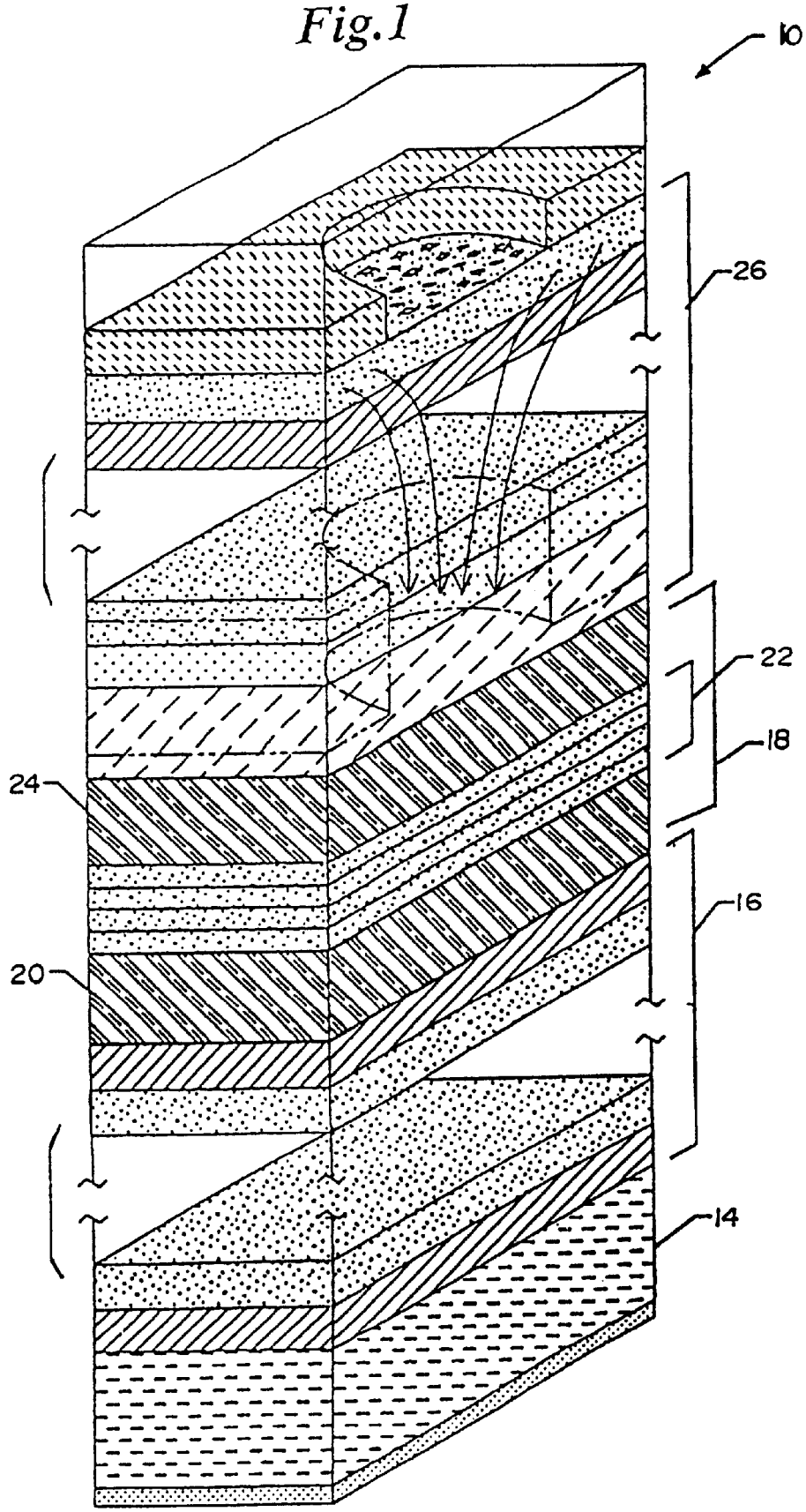
FIG. 1 is a perspective cutaway view of a VCSEL device.

FIG. 1 illustrates a typical VCSEL device, shown in a perspective, cutaway view. FIG. 1 is an illustration of a planar, current-guided, GaAs/AlGaAs top vertical cavity surface emitting laser (VCSEL) 10 with a top mirror region 26. In one embodiment, the n-doped mirror layers 16 are grown by metal organic vapor phase epitaxy (MOVPE) on an n-doped GaAs substrate 14. The n-type mirror stack 16 can be a 30.5 period n-doped (Te, $1 \times 10^{18}$ cm$^{-3}$, nominal) $Al_{0.16}Ga_{0.84}As$/AlAs bottom quarter wave stack, wherein each period contains a 200 Angstrom thick graded region. Spacer 18 has a bottom confinement layer 20 and a top confinement layer 24, wherein each of the confinement layers is formed from $Al_{0.6}Ga_{0.4}As$. The thickness of each confinement layer 20 and 24 can be chosen to make the resulting spacer 18 preferably one wavelength thick. The active region 22 can be a three 70 Angstrom thick GaAs quantum-well. The p-type mirror stack 26 can be a 22 period p-doped (Zn, $1 \times 10^{18}$ cm$^{-3}$, nominal) $Al_{0.16}Ga_{0.84}As$/AlAs DBR, wherein each period contains a 200 Angstrom thick graded region. Numerous device sizes, types and arrays may be simultaneously batch-fabricated, exploiting the flexibility of this technology platform.

In the embodiment illustrated, layers 16, 18, and 26 include aluminum bearing layers, containing layers of either AlAs or AlGaAs in this example. The aluminum bearing layers are susceptible to oxidation when exposed to an oxidizing atmosphere. Non-aluminum layers, such as substrate 14 and active region 22, are less susceptible to oxidation when the edges are exposed to an oxygen containing atmosphere, but may form a native oxide to some degree.

Figure 2:
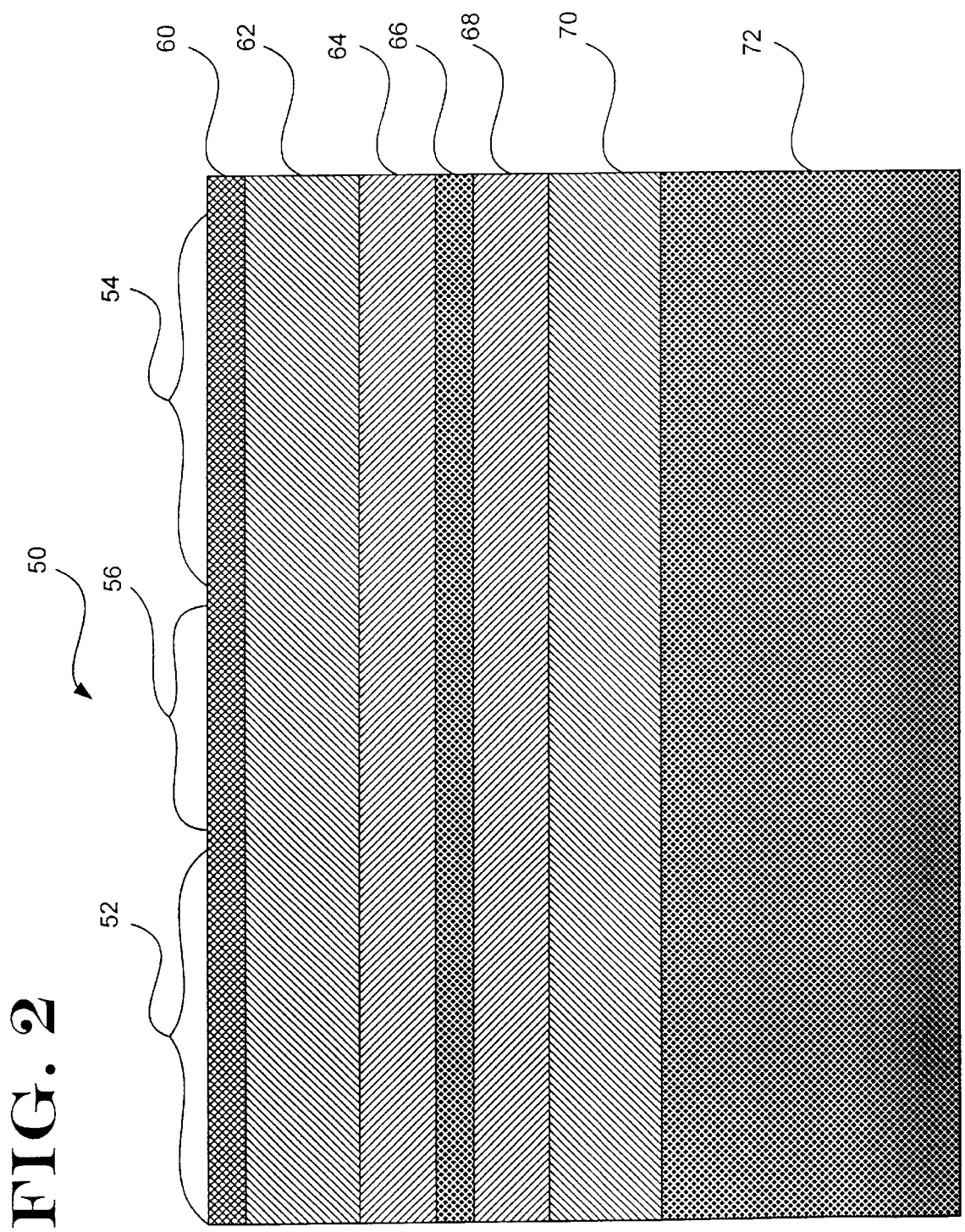
FIG. 2 is a cross-sectional side view of a wafer having multiple VCSEL die thereon.

Referring now to FIG. 2, a wafer 50 is illustrated having a first die 52 and a second die 54 separated by a street 56. Wafer 50 includes a top passivation layer 60, a top mirror region 62 having a p-type mirror stack, a top confinement region 64, an active region 66, a bottom confinement region 68, a bottom mirror region 70 having an n-type mirror stack, and a substrate 72. While compositions may vary, top and bottom confinement regions 64 and 68 can be formed of layers including AlGaAs and AlAs, and active region 66 can be formed of GaAs. Top mirror region 62 can be formed of layers including aluminum bearing material such as layers of AlAs, as can bottom mirror region 70.

Figure 3:
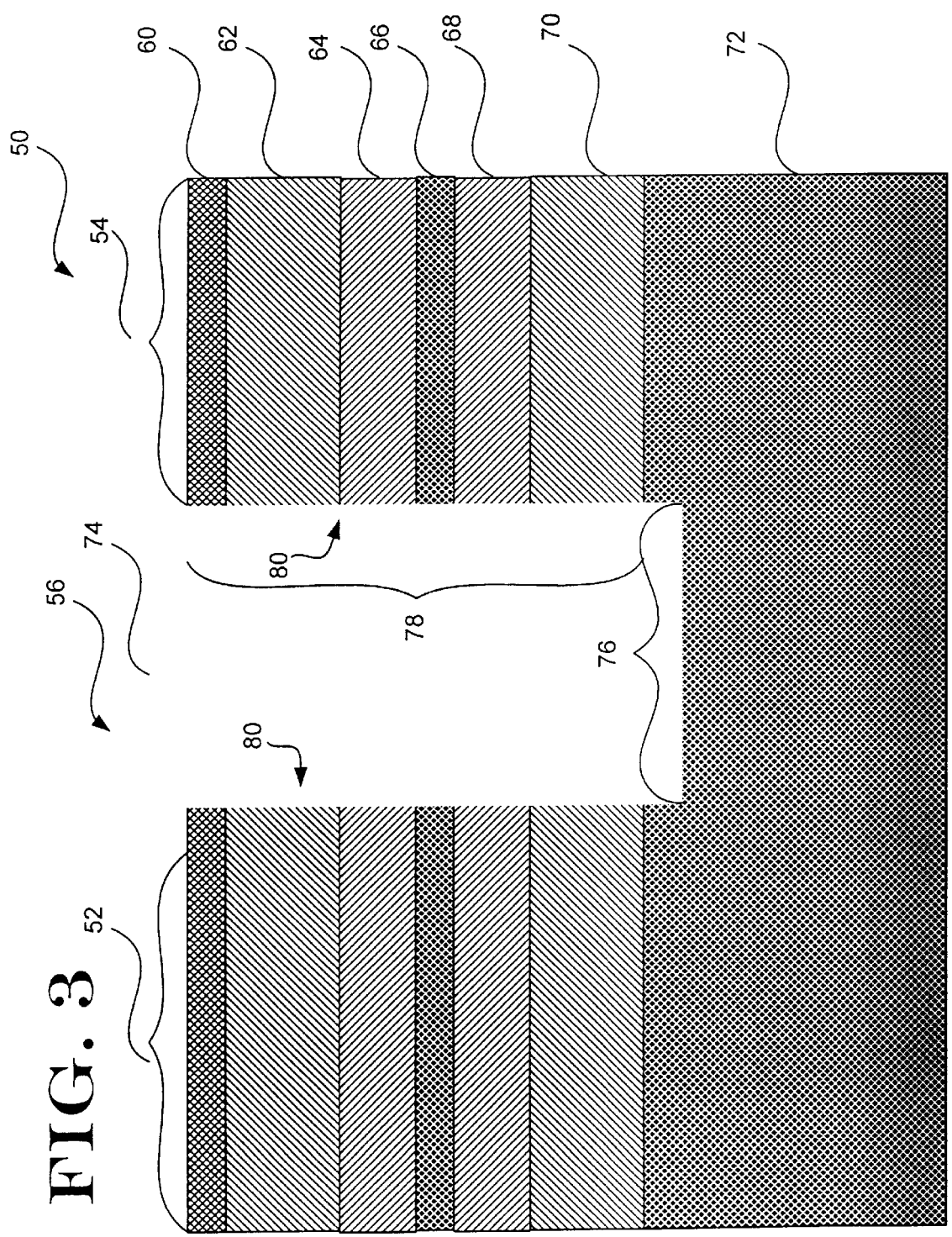
FIG. 3 is a cross-sectional side view of the wafer of FIG. 2 after formation of a channel in the wafer.

Referring now to FIG. 3, wafer 50 is illustrated after a channel 74 has been etched or otherwise cut into wafer 50, preferably along the street 56. Channel 74 is preferably etched using photolithography and chemical etching techniques well known to those skilled in the art. Other patterning techniques are also contemplated, such as plasma etching and ion milling. Channel 74 has a width indicated at 76, a depth indicated at 78, and side walls 80. In a preferred embodiment, channel 74 has a depth that is deeper than the deepest layer that is intended to be oxidized, which is often between about 5 and 10 microns. In FIG. 3, channel depth 78 is preferably sufficiently deep to cut into the lowest or deepest aluminum bearing layer, which is layer 70 in this illustration. In many wafers, channel 74 may be cut at least into bottom mirror layer 70, if not into substrate 72. Cutting channel 74 to this depth can enable oxidizing all the aluminum bearing layers. Channel width 76 is preferably wider than the width of the final cut made through the wafer to form the discrete chips to prevent damage to the oxidized side walls.

After forming channel 74, the channel can be oxidized using an oxidizing atmosphere or fluid. A preferred oxidizing atmosphere includes hot, moist air or steam. One such suitable oxidization process is described in U.S. Pat. No. 5,696,023 to Holonyak, Jr. et al., which is incorporated herein by reference. Other oxidizing environments may include, for example, oxygen, or oxygen radicals flowing in a carrier gas such as nitrogen.

Figure 4:
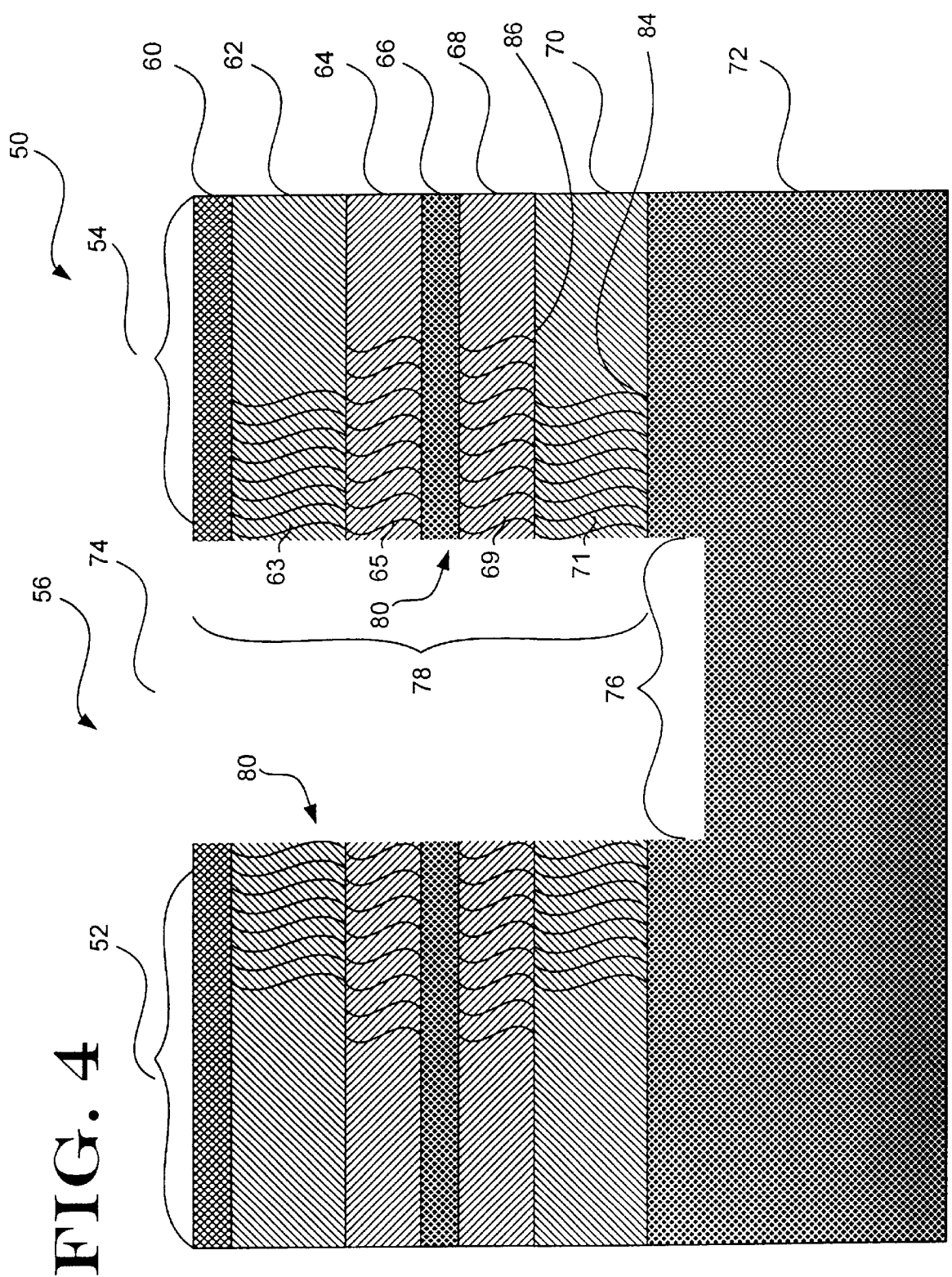
FIG. 4 is a cross-sectional side view of the wafer of FIG. 3 after the channels are exposed to an oxidizing environment.

Referring now to FIG. 4, channel 74 is illustrated after oxidation. The aluminum bearing layers are illustrated having oxidized portions extending inward from channel walls 80. Layers 62, 64, 68, and 70 may be seen to have oxidized portions at 63, 65, 69, and 71 respectively. The lateral extent of the oxidation may vary depending on the composition of the layer. For example, bottom mirror layer 70 has a lateral oxidation extent indicated at 84, which is different than the lateral oxidation extent of bottom confinement region 68 indicated at 86. In one embodiment, the lateral extent of the native oxidation is between about 10 and 15 microns. The extend of lateral oxidation can be controlled by controlling the time that the wafer is exposed to the oxidizing environment. Temperature, steam pressure, and other factors also influence the lateral oxidation rate, and thus are also preferably controlled.

FIG. 4 illustrates layers 62, 64, 68, and 70 as monolithic layers for ease of illustration. Those skilled in the art will recognize that such layers are often not monolithic but formed of alternating sub-layers, some of which sub-layers may not form a native oxide or may form a native oxide at a smaller rate. Thus, the oxidized layers illustrated in FIG. 4 may actually be formed of alternating sublayers where one sublayer is oxidized and the adjacent sublayer is not oxidized or oxidized to a lesser degree. Applicants do not believe this to be a problem as the non-aluminum bearing layers typically do not require passivation prior to exposure to adverse environments.

The oxidized aluminum bearing layers are believed to include aluminum oxide, where the aluminum oxides are in an anhydrous form such as alpha-$Al_2O_3$ and gamma-$Al_2O_3$.

The oxidized aluminum bearing layers are also believed to include anhydrous forms of aluminum oxide hydroxides such as AlO(OH), diaspore and boehmite. These forms of oxidized aluminum are believed to be more stable, and discourage the formation of other oxygen rich compounds, such as aluminum oxide hydrates and aluminum suboxides.

Figure 5:
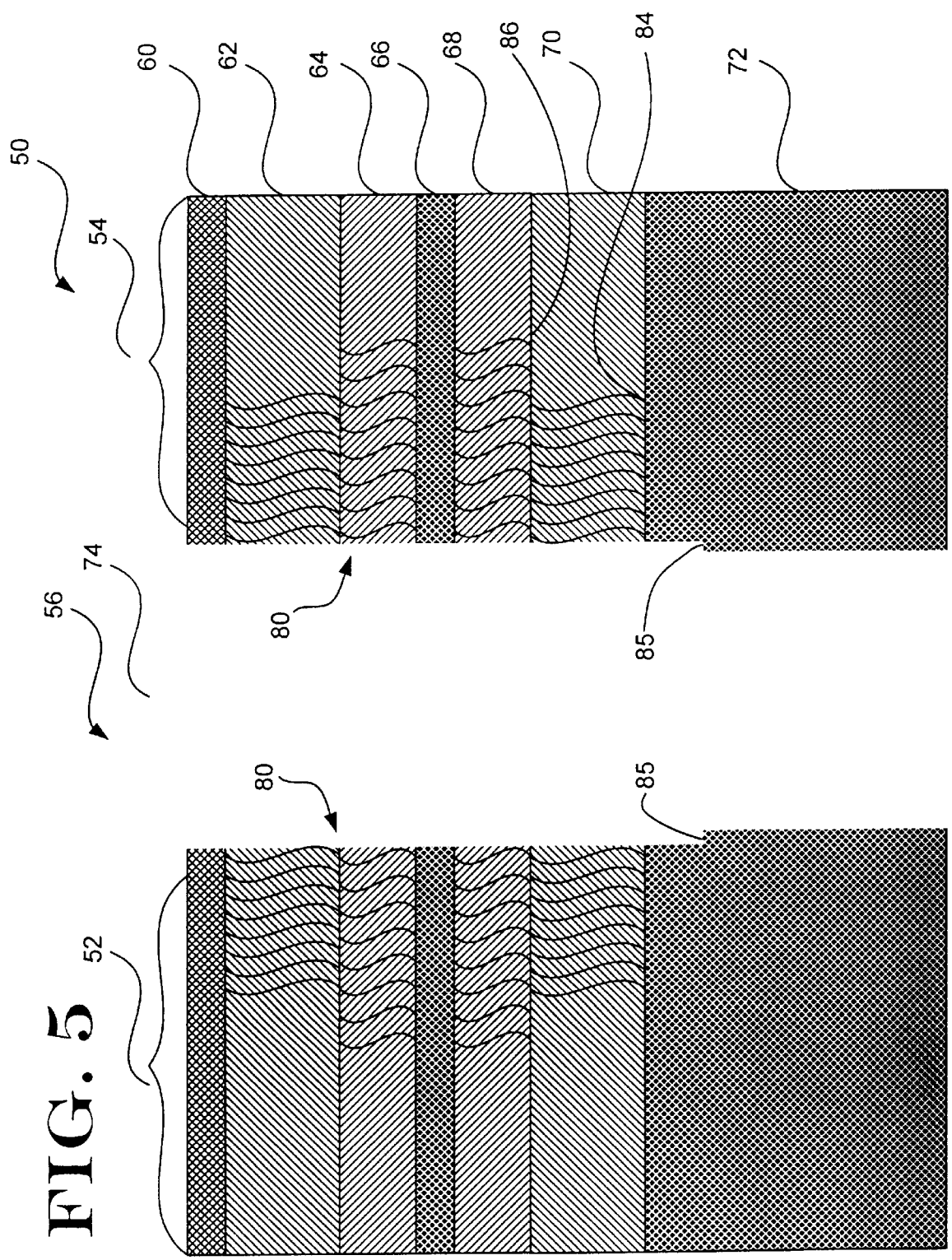
FIG. 5 is a cross-sectional side view of the wafer of FIG. 4 after cutting through the channel to form discrete chips.

After oxidation is complete, and as shown in FIG. 5, wafer 50 can be cut using conventional techniques well known to those skilled in the art. Wafer 50 can be cut or cleaved along channel 74 using a conventional blade or other cutting or cleaving instrument. The first die 52 is then separated from the second die 54 along the cut or cleave. The width of the cut is preferably less than the channel width to preserve the lateral width or penetration into the oxidized aluminum bearing layers. Because the width of the cut is preferably less than the channel width, a shoulder 85 is often provided. The shoulder 85 corresponds to the portion of the bottom surface of the channel 74 that is not removed during the cutting process.

Preferably, the oxidation is performed before the chips are cut into discrete chips. This has the advantage of maintaining the wafer in a single piece and eases handling. In another method, however, the wafer can be cut into individual die prior to oxidation. In this method, the discrete chips have the entire edge exposed to the oxidizing fluid and require no further cutting after oxidation. In this latter method, no channels need to be formed before the wafer is cut into discrete die.

Because of the protective oxidization layer, the present invention may allow VCSELs and other devices to be directly mounted on circuit boards using conventional methods such as wire bonding or surface mounting. In addition, it is contemplated that the present invention may allow VCSELs or other devices to be mounted in smaller, non-hermetic plastic packages. Finally, it is contemplated that the present invention may reduce chip sizes by allowing devices to be placed closer to the chip edge, which may increase yield and reduce the cost of such devices.

While the invention is described above primarily with reference to a VCSEL device, it is contemplated that the present invention may be applied to any electronic device that includes aluminum bearing Group III–V semiconductor layers. Such device may include, for example, various linear or digital circuits, various opto-electonic devices, etc.

Numerous advantages of the invention covered by this document have been set forth in the foregoing description. It will be understood, however, that this disclosure is, in many respects, only illustrative. Changes may be made in details, particularly in matters of shape, size, and arrangement of parts without exceeding the scope of the invention. The invention's scope is, of course, defined in the language in which the appended claims are expressed.

What is claimed is:

1. A die having at least one vertical cavity surface emitting laser (VCSEL) device, the die having a top surface and a bottom surface with at least one side edge extending along at least a portion of the perimeter of the die between the top surface and the bottom surface, the die comprising:
    at least one aluminum bearing layer below the top surface of said die and extending to the at least one side edge of said die, said at least one aluminum bearing layer oxidized from said at least one side edge of said die a penetration distance into said die.

2. A die as recited in claim 1, wherein said oxidized layer penetration distance is at least about 5 microns.

3. A die as recited in claim 1, wherein said oxidized layer penetration distance is between about 10 and 15 microns.

4. A die as recited in claim 1, wherein at least one of said at least one aluminum bearing layer includes AlAs.

5. A die as recited in claim 1, wherein at least one of said at least one aluminum bearing layer includes AlGaAs.

6. A die as recited in claim 1, wherein said at least one side edge has a shoulder located somewhere below the depth of at least one of the at least one aluminum bearing layer.

7. An apparatus comprising:
    a carrier having a plurality of electronic components;
    a die having at least one VCSEL, the die having a top surface and a bottom surface, at least one side edge extending along at least a portion of the perimeter of the die between the top surface and the bottom surface, and at least one aluminum bearing layer below the top surface and extending to the at least one side edge, said at least one aluminum bearing layer oxidized from said at least one side edge a penetration distance into said die; and
    said die mounted to said carrier without hermetically sealing the die in a hermetic package.

8. An apparatus as recited in claim 7, wherein said at least one side edge of said die is exposed to said surrounding atmosphere.

9. An apparatus as recited in claim 7, wherein said die is not mounted in a package.

10. An apparatus as recited in claim 7, wherein said die is mounted in a non-hermetic package.

11. A structure having at least one vertical cavity surface emitting laser (VCSEL), the structure having a top surface, comprising:
    a number of layers each having at least one side edge, with at least some of the number of layers bearing aluminum, one of said aluminum bearing layers being the aluminum bearing layer that is located the furthest from the top surface of the structure; and
    at least the aluminum bearing layer that is located the furthest from the top surface of the structure being oxidized a penetration distance into said at least one side edge.

12. A structure as recited in claim 11, where all of the aluminum bearing layers are oxidized a penetration distance into said at least one side edge.

13. A structure as recited in claim 12 wherein the penetration distance for at least two of the aluminum bearing layers is different.

* * * * *

UNITED STATES PATENT AND TRADEMARK OFFICE
CERTIFICATE OF CORRECTION

PATENT NO. : 6,674,777 B1
DATED : January 6, 2004
INVENTOR(S) : James C. Nohava et al.

It is certified that error appears in the above-identified patent and that said Letters Patent is hereby corrected as shown below:

Title page,
Item [75], Inventors, change "Eva M. B. Strzelecka" to -- Eva M. B. Strzelecki --
Item [56], References Cited, OTHER PUBLICATIONS, "Hayashi" reference, change "InGaAs-GaAIAs" to -- InGaAs-GaAlAs --

Column 4,
Line 48, before "of" change "extend" to -- extent --

Signed and Sealed this

Fourteenth Day of December, 2004

JON W. DUDAS
*Director of the United States Patent and Trademark Office*